US010819237B1

(12) United States Patent
Petrina et al.

(10) Patent No.: US 10,819,237 B1
(45) Date of Patent: Oct. 27, 2020

(54) GATE VOLTAGE PLATEAU COMPLETION CIRCUIT FOR DC/DC SWITCHING CONVERTERS

(71) Applicant: Texas Instruments Incorporated, Dallas, TX (US)

(72) Inventors: Gaetano Maria Walter Petrina, Kirchdorf an der Amper (DE); Joerg Kirchner, Mauern (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/403,999

(22) Filed: May 6, 2019

(51) Int. Cl.
*H02M 1/08* (2006.01)
*H02M 3/158* (2006.01)
*H04M 1/02* (2006.01)

(52) U.S. Cl.
CPC .......... *H02M 3/1582* (2013.01); *H02M 1/08* (2013.01); *H03K 2217/0063* (2013.01); *H04M 1/0202* (2013.01)

(58) Field of Classification Search
CPC .... H02M 1/08; H02M 3/1582; H03K 5/2472; H03K 2217/0063
USPC .......................................................... 327/109
See application file for complete search history.

(56) References Cited

U.S. PATENT DOCUMENTS

| | | | |
|---|---|---|---|
| 5,796,276 A * | 8/1998 | Phillips | H03K 17/063 323/315 |
| 10,461,730 B1 * | 10/2019 | Mariconti | H03K 17/163 |
| 2002/0109417 A1 * | 8/2002 | Torrisi | H03K 17/168 307/125 |
| 2015/0372678 A1 * | 12/2015 | Zhang | H03K 17/0822 327/109 |
| 2020/0099367 A1 * | 3/2020 | Bodano | H02M 1/08 |

* cited by examiner

*Primary Examiner* — William Hernandez
(74) *Attorney, Agent, or Firm* — Lawrence J. Bassuk; Charles A. Brill; Frank D. Cimino

(57) ABSTRACT

A DC/DC switching converter includes high-side and low-side power NFETs coupled in series between a first pin for coupling to a first supply voltage and a second pin for coupling to a second supply voltage. A switch-node is coupled to a third pin. A first gate driver is coupled to drive a gate voltage on the high-side power NFET at a first rate and a second gate driver is coupled to drive the gate voltage of the high-side power NFET at a second rate that is higher than the first rate. A comparator is coupled to the first pin and to the gate of the high-side power NFET and further coupled to turn on the second gate driver when a gate voltage of the high-side power NFET is equal to the first supply voltage coupled to the first pin plus a threshold voltage of the high-side power NFET.

10 Claims, 6 Drawing Sheets

GATE VOLTAGE PLATEAU COMPLETION CIRCUIT FOR DC/DC SWITCHING CONVERTERS

FIELD OF THE DISCLOSURE

Disclosed embodiments relate generally to the field of DC/DC switching converters. More particularly, and not by way of any limitation, the present disclosure is directed to a gate voltage plateau completion circuit for DC/DC switching converters.

SUMMARY

Disclosed embodiments provide a DC/DC switching converter with a gate voltage plateau completion circuit that detects when the gate voltage of a power transistor, e.g., a power NFET, reaches the end of the Miller plateau. The gate voltage plateau completion circuit provides a more accurate determination of the end of the plateau, which in turn may provide both greater stability and greater efficiency to a DC/DC switching converter that utilizes the circuit.

In one aspect, an embodiment of an electronic device is disclosed. The electronic device includes a first power NFET coupled in series with a second power NFET between a first pin for coupling to a first supply voltage and a second pin for coupling to a second supply voltage, a switch-node between the first power NFET and the second power NFET being coupled to a third pin for coupling through an inductor to a third supply voltage; a first gate driver coupled to receive a first on-signal and to drive a gate voltage on the first power NFET at a first rate; a second gate driver coupled to receive a second on-signal and to drive the gate voltage of the first power NFET at a second rate that is higher than the first rate; and a comparator coupled to the first pin and to a gate of the first power NFET and further coupled to turn on the second gate driver when a gate voltage of the first power NFET is equal to a first supply voltage coupled to the first pin plus a threshold voltage of the first power NFET.

In another aspect, an embodiment of a gate voltage plateau completion circuit for a power NFET in a DC/DC switching converter is disclosed. The gate voltage plateau completion circuit includes a first P-type field effect transistor (PFET) having a gate coupled to a first pin for coupling to an input voltage and a drain coupled to a gate of the power NFET; a second PFET having a gate coupled to the first pin and a source coupled to a source of the first PFET; and a plurality of diodes coupled in series between the first pin and a first node that lies between the first PFET and the second PFET.

In yet another aspect, an embodiment of a method of operating an integrated circuit (IC) chip that comprises a DC/DC switching converter is disclosed. The method includes coupling an input supply voltage to a first pin, the first pin being coupled to a gate voltage plateau completion circuit and to a drain of a high-side power NFET; driving the high-side power NFET using a first gate driver circuit that charges a gate of the high-side power NFET at a first rate; comparing, at the gate voltage plateau completion circuit, a gate voltage of the high-side power NFET to the input supply voltage plus the threshold voltage of the high-side power NFET; and responsive to determining that the gate voltage of the first NFET is equal to the input voltage plus the threshold voltage of the high-side power NFET, turning on a second gate driver circuit that charges the gate of the high-side power NFET at a second rate that is faster than the first rate.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 6:
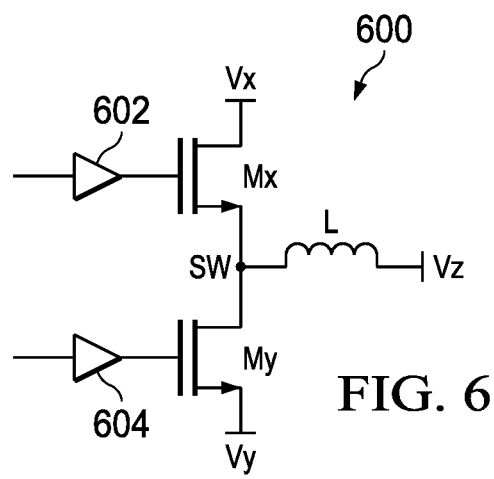
FIG. 6 depicts a generalized version of a DC/DC switching converter.

There are a number of different types of DC/DC switching converters, e.g., buck or boost, with a number of combinations and variations on the basic switching converter, but FIG. 6 depicts the general configuration of a DC/DC switching converter 600. DC/DC switching converter 600 includes a two power transistors Mx and My, which are coupled in series between supply voltage Vx and supply voltage Vy; a switch-node SW between the two power transistors is coupled to a first terminal of an inductor L, while the second terminal of inductor L is coupled to supply voltage Vz.

In DC/DC switching converter 600, both of power transistors Mx and My are N-type field effect transistors (NFETs), although there can be variations to this configuration in which a high-side power transistor is a P-type field effect transistor (PFET) or one of the power transistors Mx and My is replaced by a power diode. Gate driver 602 is coupled to drive the gate of power transistor Mx and gate driver 604 is coupled to drive the gate of power transistor My, with the gate of power transistor Mx and the gate of power transistor My coupled to be driven in opposition. Typically, one of power transistors Mx and My is configured to charge inductor L, while the remaining power transistor is configured to drain the inductor L.

Figure 6A:
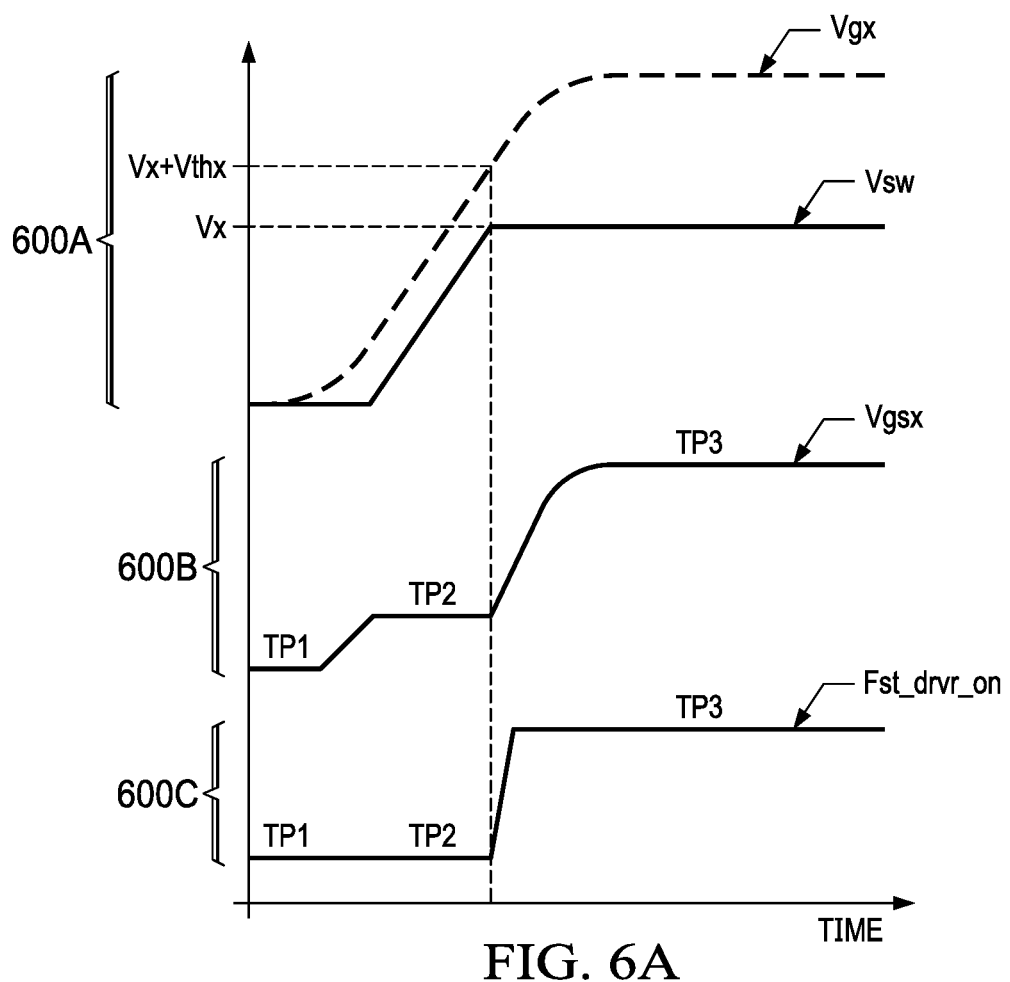
FIG. 6A depicts an example of several desired waveforms for a DC/DC switching converter.

FIG. 6A depicts several waveforms that are associated with the operation of power transistor Mx of DC/DC switching converter 600, in which power transistor Mx is assumed to be the power transistor that charges the inductor L. Graph 600A includes the gate voltage Vgx for the power transistor Mx and the switch-node voltage Vsw; graph 600B depicts the gate/source voltage Vgsx for the power transistor Mx; and graph 600C depicts a fast driver turn on signal Fst_drvr_on, which will be explained.

The waveforms are shown during three time periods during the time when power transistor Mx is turned on. During a first time period TP1, the gate/source voltage Vgsx starts at zero so that power transistor Mx is off. During a second time period TP2, the gate voltage Vgx of power transistor Mx starts to rise as gate driver 602 provides a current; once the gate voltage Vgx reaches a threshold voltage Vthx, the switch-node voltage Vsw begins to rise in parallel with gate voltage Vgx as the gate turns on and current flows through power transistor Mx. As power transistor Mx turns on, the gate/source voltage Vgsx initially rises, then forms a plateau known as the Miller plateau as gate voltage Vgx and switch-node voltage Vsw rise in parallel. Once the plateau level ends, a third time period TP3 begins in which the switch-node voltage Vsw has reached the value of supply voltage Vx, but gate voltage Vgx continues to rise so that gate/source voltage Vgsx rises to a maximum value that determines the on-resistance of power transistor Mx.

The efficiency and stability of the DC/DC switching converter 600 depend on the way the gate voltage Vgx is controlled in the third phase after the plateau reaches an end. That is, it can be desirable for power transistor Mx to turn on rather slowly until the plateau level is completed, because faster turn-on can create more electromagnetic interference (EMI) and noise. However, once the end of the plateau is reached, it can also be desirable to turn on a second driver circuit (not specifically shown in FIG. 6) to reach a maximum gate voltage Vgx on power transistor Mx as quickly as possible in order to achieve the lowest on-resistance. The fast driver turn on signal Fst_drvr_on provides the transition between the desired slow initial gate charging and a later fast gate charging, but needs to be properly timed. As seen in graph 600C, it is desirable that fast driver turn on signal Fst_drvr_on goes high as the end of the plateau is reached in order to provide optimal charging of power transistor Mx.

Figure 6B:
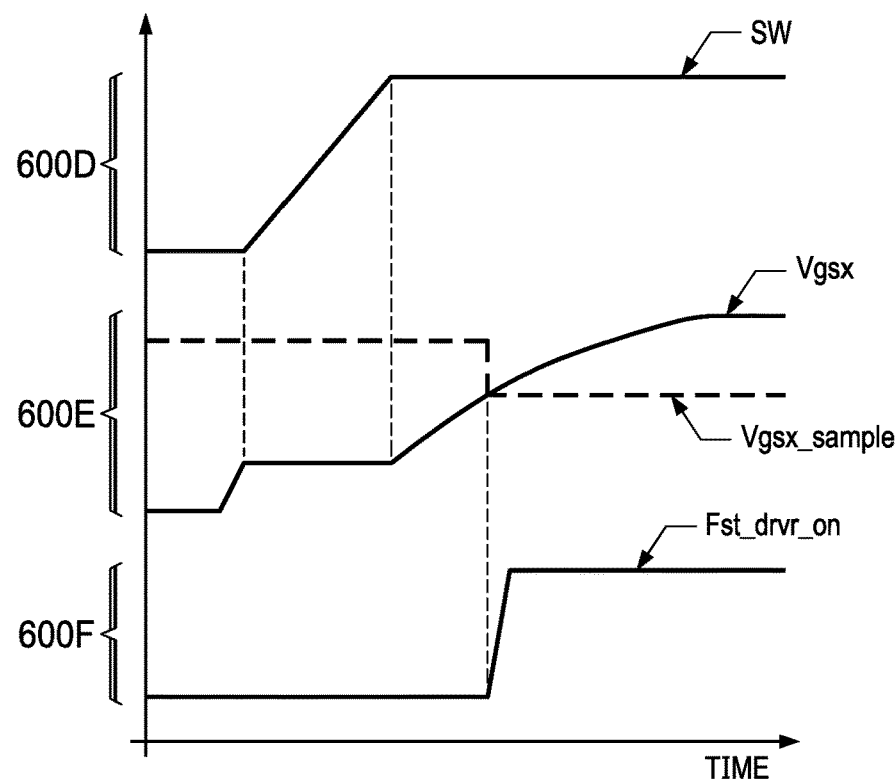
FIGS. 6B and 6C depict how the waveforms of FIG. 6A can appear when there is no gate voltage plateau completion circuit to correctly time the change to a faster charging rate.

One problem with achieving an optimal operation on DC/DC switching converter 600 is that measuring the value of the gate/source voltage Vgsx is inaccurate, because the switch-node will trigger a comparator at a value that is the threshold voltage Vthx of power transistor Mx below the final value of the switch-node voltage Vsw. To correct for this error, additional delay can be added, but this additional delay is generally an estimate and can cause two types of problems if the estimate is not correct, as shown in FIGS. 6B and 6C.

A first problem caused by an incorrect detection of the end of the Miller plateau is related to control of the duty cycle for DC/DC switching converter 600. A double loop controller configuration (not specifically shown) can be used to calculate the duty cycle, but to do so the double loop controller needs to detect the gate voltage Vgx for power transistor Mx once the gate voltage Vgx has reached a final value in order to measure the current through the power transistor Mx. FIG. 6B depicts a situation in which fast driver turn on signal Fst_drvr_on is triggered at a point after the Miller plateau has ended, so that the gate/source voltage Vgsx rises more slowly than desired. The slow rise of gate/source voltage Vgsx means that a gate/source voltage sample Vgsx_sample that is taken at a predetermined time does not receive a final value of gate/source voltage Vgsx. This sampling error can cause DC/DC switching converter 600 to have subharmonic oscillations and provide unstable operation.

Figure 6C:
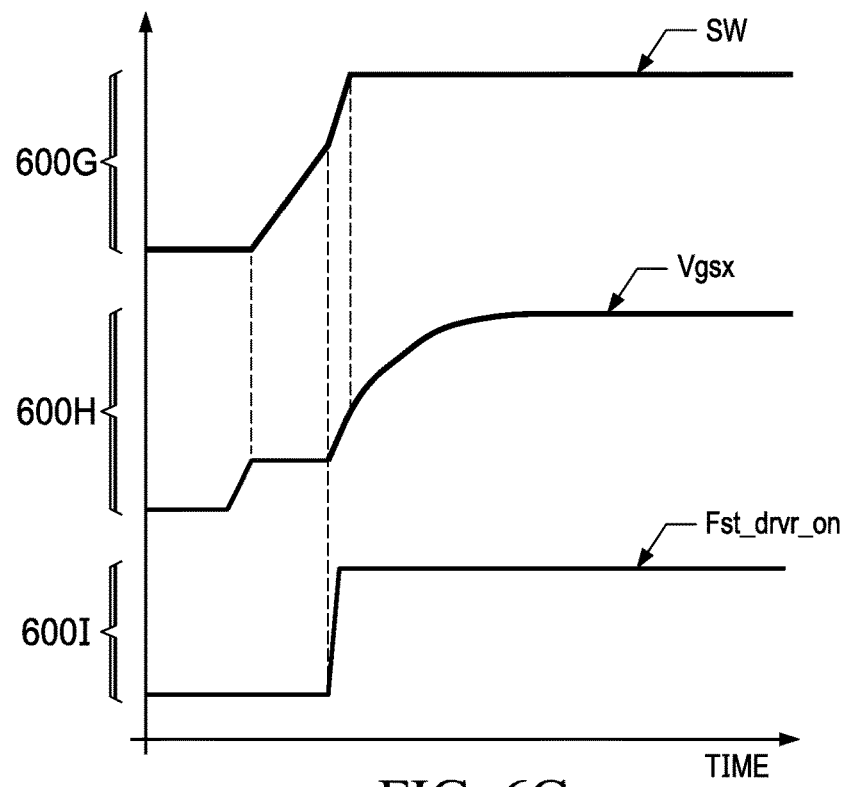

FIG. 6C depicts a second situation in which the fast driver turn on signal Fst_drvr_on occurs too quickly, i.e., before the plateau is ended. In this situation, the charging of switch-node SW changes speed, potentially causing the EMI that the slow initial charge is intended to avoid. Additionally, the premature fast charging affects the gain of power transistor Mx, which no longer works as well as desired.

Figure 1:
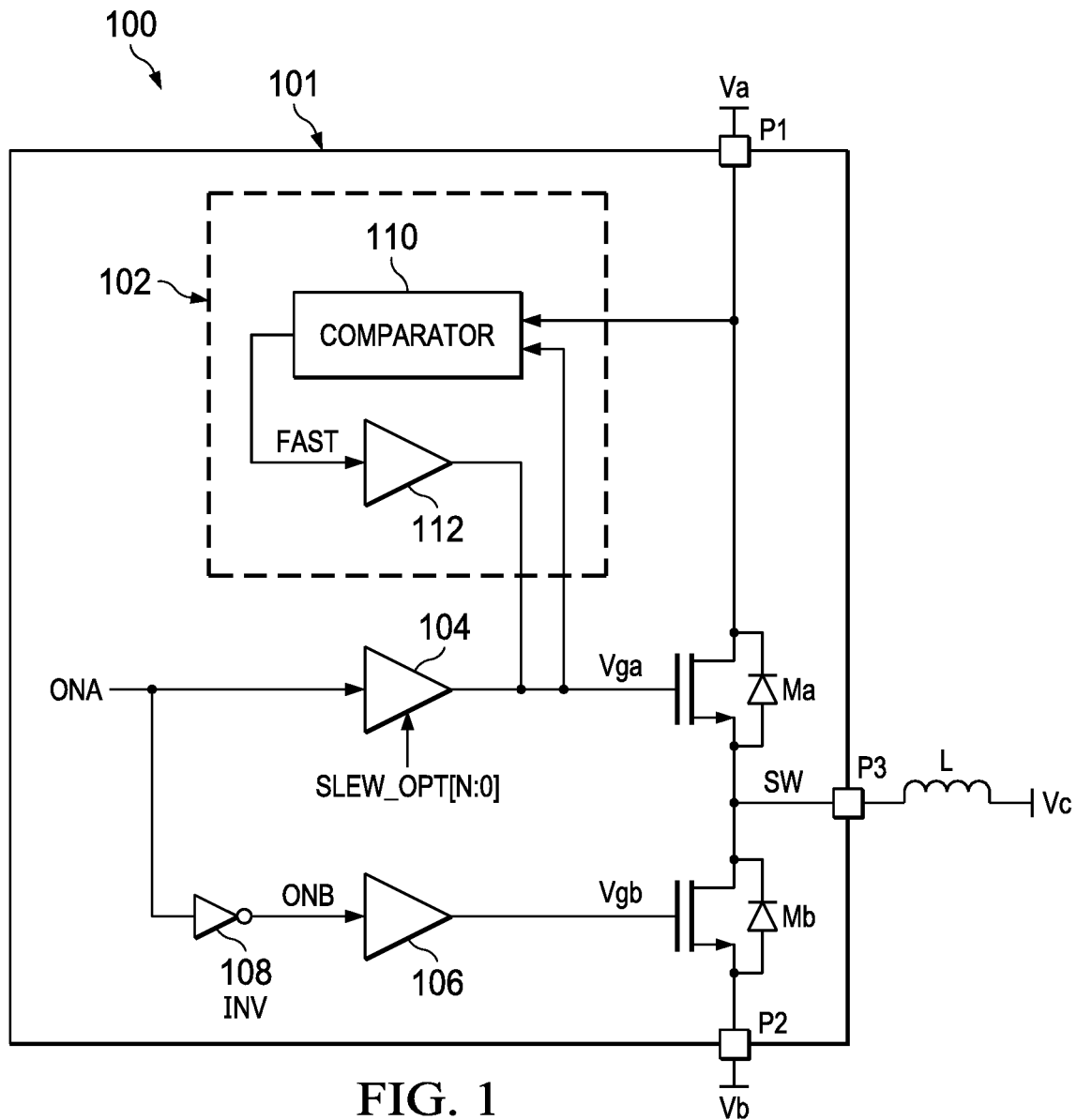
FIG. 1 depicts block diagram of a DC/DC switching converter containing a gate voltage plateau completion circuit according to an embodiment of the disclosure.

FIG. 1 depicts an example of a generalized DC/DC switching converter 100 that includes a gate voltage plateau completion circuit 102 that can identify the completion of the gate voltage plateau and thus correct the issues identified above. DC/DC switching converter 100 includes a first power NFET Ma that is coupled in series with a second power NFET Mb between a first pin P1 and a second pin P2 of IC chip 101. As noted previously, in at least one embodiment, the second power NFET Mb can be replaced by another power device, e.g., a power diode. A switch-node SW lies between the first power NFET Ma and the second power NFET Mb and is coupled to a third pin P3. In this generalized embodiment, first pin P1 is coupled to a first supply voltage Va, second pin P2 is coupled to a second supply voltage Vb and third pin P3 is coupled to an inductor L and through the inductor L to third supply voltage Vc. For the purposes of this patent application, first power NFET Ma is assumed to be the power transistor that charges the inductor L and second power NFET Mb is assumed to be the power transistor that drains the inductor L, as the gate voltage plateau completion circuit 102 is always coupled to the power transistor that charges the inductor.

Although it is common to speak of each power transistor as being driven by a single gate driver, as has been discussed with regard to FIG. 6A first power NFET Ma may be driven initially by a first gate driver 104 that drives the gate at a first rate and, once the gate voltage plateau has been completed, by a second gate driver 112 that drives the gate at a second rate that is faster than the first rate. Second power NFET Mb is driven by a gate driver 106. A first on-signal ONA is coupled to an input to first gate driver 104; first on-signal ONA is also coupled to an input of an inverter 108, which is then coupled to provide the inverted signal as a second on-signal ONB to an input of gate driver 106. In at least one embodiment, first gate driver 104 includes a slew option SLEW_OPT in which the speed at which the gate of first power NFET Ma is initially charged can be set by a customer, e.g., by a value provided to a pin or by register input.

Rather than comparing the gate voltage Vga of first power NFET Ma to the switch-node voltage Vsw, as in the past, gate voltage plateau completion circuit 102 uses gate voltage Vga and the first supply voltage Va. The gate voltage plateau completion circuit 102 includes the second gate driver 112 and a comparator 110 that is able to compare a first gate voltage Vga of first power NFET Ma to an expected maximum value of switch-node SW, which is the same as first supply voltage Va, plus a threshold voltage Vth,ma of first power NFET Ma. Comparator 110 is coupled to the first pin P1 and is also coupled to the gate of first power NFET Ma. An output of comparator 110 is coupled to provide a fast-driver signal FAST to turn on the second gate driver 112 when first gate voltage Vga is equal to the first supply voltage on the first pin P1 plus threshold voltage Vth,ma of first power NFET Ma.

Figure 2:
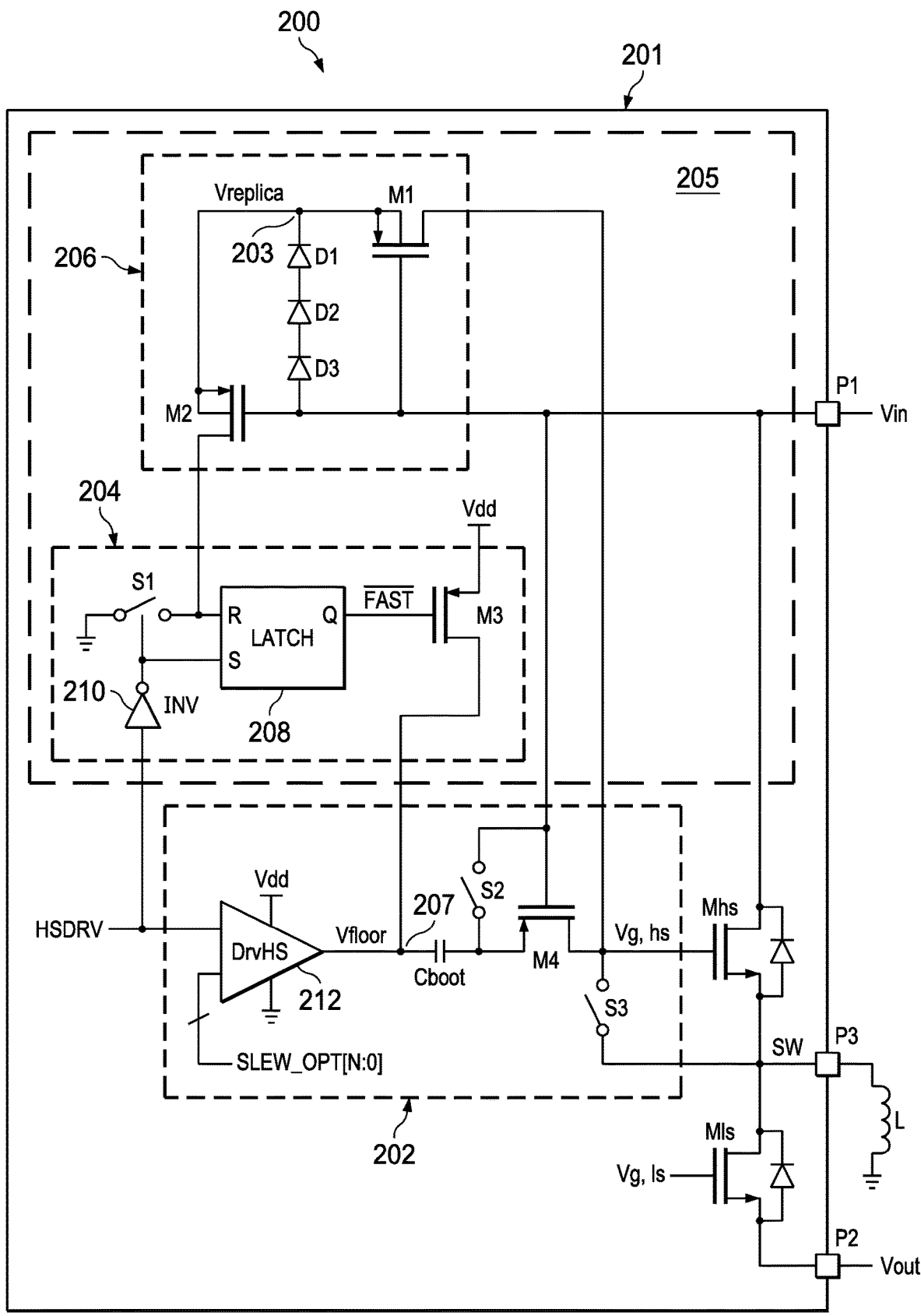
FIG. 2 depicts a specific implementation of an inverting buck boost converter containing a gate voltage plateau completion circuit according to an embodiment of the disclosure.

While FIG. 1 illustrates a generalized version of a DC/DC switching converter 100 and gate voltage plateau completion circuit 102, FIG. 2 depicts a specific embodiment of a DC/DC switching converter. In the embodiment of FIG. 2, the DC/DC switching converter is an inverting buck boost converter 200 and a corresponding gate voltage plateau completion circuit 205 that are implemented on an IC chip 201. Inverting buck boost converter 200 includes a high-side power NFET Mhs coupled in series with a low-side power NFET Mls between the first pin P1 and the second pin P2. Switch-node SW lies between high-side power NFET Mhs and low-side power NFET Mls and is coupled to the third pin P3, which can be coupled to an external inductor L. Inverting buck boost converter 200 is a synchronous inverting buck boost converter, high-side power NFET Mhs is the power transistor that charges inductor L and low-side power NFET Mls is the power transistor that drains inductor L. In the illustrated embodiment, first pin P1 is coupled to an input voltage Vin, second pin P2 is coupled to output voltage Vout and third pin P3 is coupled to a ground plane through inductor L. In one embodiment, input voltage Vin is about 3 V and output voltage Vout is about −9 V.

The circuits that combine to provide control of high-side power NFET Mhs include a first gate driver circuit 202, a second gate driver circuit 204 and a comparator 206, with second gate driver circuit 204 and comparator 206 forming gate voltage plateau completion circuit 205. Comparator 206 includes a first PFET M1 and a second PFET M2, which are coupled in series between the gate of high-side power NFET Mhs and an input to the second gate driver circuit 204. First PFET M1 and second PFET M2 have respective sources coupled together at a first node 203 and have respective gates coupled to the first pin P1.

Second PFET M2 is used as the main plateau detector, with a threshold voltage Vth,m2 that is the same as the threshold voltage Vth,mhs for high-side power NFET Mhs and a source voltage that can track the high-side gate voltage Vg,hs, so that second PFET M2 is turned on at the same time that the high-side gate voltage Vg,hs reaches the end of the Miller plateau. However, because the high-side gate voltage Vg,hs can go down to Vout, i.e., when low-side power NFET Mls is on and high-side power NFET Mhs is off, first PFET M1 is used to protect the source of second PFET M2 when the high-side gate voltage Vg,hs goes too low. A first diode D1, second diode D2 and third diode D3 are coupled in series between the first pin P1 and first node 203. A cathode of first diode D1 is coupled to first node 203 and an anode of a last diode, e.g., third diode D3, is coupled to the first pin P1 to ensure that the voltage on first node 203, called replica voltage Vreplica, does not go lower than three diode drops below the input voltage Vin. It will be understood that the number of diodes used between the gates and sources of first PFET M1 and second PFET M2 is dependent on the specific circuit embodiment and that the number of diodes may vary from the number illustrated.

Second gate driver circuit 204 includes a latch 208, a third PFET M3, a first switch S1 and an inverter 210. The output of latch 208 is coupled to drive the gate of third PFET M3 using the fast-driver signal /FAST, which goes low to turn on third PFET M3. First switch S1 is coupled between the reset input R of latch 208 and a lower rail while control of first switch S1 is provided through an inverter 210 that is coupled to receive high-side driver signal HSDRV at the input to first gate driver circuit 202. Latch 208 has a reset input R that is coupled to the drain of second PFET M2 and a set input S that is coupled to receive the output of inverter 210. When high-side driver signal HSDRV is low so that high-side power NFET Mhs is off, the set input of latch 208 is held high and first switch S1 is closed, holding the reset input of latch 208 low such that fast-driver signal /FAST is high and holds third PFET M3 off. When high-side driver signal HSDRV goes high, the set input of latch 208 goes low and first switch S1 is opened, allowing the signal from second PFET M2 to trigger the reset of latch 208. Third PFET M3 is used to drive the floor control voltage Vfloor to the fourth supply voltage Vdd quickly, while latch 208 keeps a memory of the detected plateau.

First gate driver circuit 202 includes a high-side driver circuit 212 that is coupled between the fourth supply voltage Vdd and a ground plane. High-side driver circuit 212 includes a slew option SLEW_OPT, which can be used to select a first rate at which the gate of high-side power NFET Mhs is initially charged. A bootstrap capacitor Cboot is coupled between the output of high-side driver circuit 212 and the gate of high-side power NFET Mhs, with a drain of third PFET M3 coupled to a second node 207 that is between high-side driver circuit 212 and bootstrap capacitor Cboot. A fourth PFET M4 is coupled between bootstrap capacitor Cboot and the gate of high-side power NFET Mhs, with the gate of fourth PFET M4 coupled to the first pin P1. A second switch S2 provides a switchable coupling between the gate and the source of fourth PFET M4 and a third switch S3 provides a switchable coupling between the gate of high-side power NFET Mhs and switch-node SW.

During operation of inverting buck boost converter 200, high-side power NFET Mhs and low-side power NFET Mls are driven in opposition using high-side control signal HSDRV and low-side control signal LSDRV. When high-side control signal HSDRV is low, the gate voltage Vg,ls is high so that low-side power NFET Mls is on and switch-node SW is equal to Vout, which in one embodiment is −9 V. Because high-side control signal HSDRV is low, the floor control voltage Vfloor that is output to a first terminal of bootstrap capacitor Cboot is equal to zero. Second switch S2 is closed so that a second terminal of bootstrap capacitor Cboot is charged to input voltage Vin. Third switch S3 is also closed so that the high-side gate voltage Vg,hs is equal to the voltage on switch-node SW and to output voltage Vout. At the same time, floor control voltage is equal to zero volts and replica voltage Vreplica is at input voltage Vin minus three diode drops. In one embodiment, input voltage Vin is 3.8 V and a voltage drop is 0.6 V, so that replica voltage Vreplica is equal to 2 V.

When high-side control signal HSDRV goes high, the low-side gate voltage Vg,ls is equal to output voltage Vout so that low-side power NFET Mls is off. High-side driver circuit 212 charges a floor control voltage Vfloor towards the fourth supply voltage Vdd at a first rate, which may be a slower rate to avoid noise. Both second switch S2 and third switch S3 are now open and the second terminal of bootstrap capacitor Cboot, which was already charged to the value of input voltage Vin, moves toward a value of (Vin+Vdd). Because the source of fourth PFET M4 is now greater than the gate of fourth PFET M4, fourth PFET M4 turns on, sharing the rising voltage with the gate of high-side power NFET Mhs and the high-side gate voltage Vg,hs also rises at the slower rate. As high-side gate/source voltage Vgs,hs reaches the plateau, which in one embodiment is at about 1.2 V, switch-node voltage Vsw starts to rise. As soon as high-side gate voltage Vg,hs rises to the current value of replica voltage Vreplica, which in one example is about 2 volts, the replica voltage Vreplica starts to follow the high-side gate voltage Vg,hs.

Second PFET M2 turns on when replica voltage Vreplica reaches (Vin+Vth,m2), i.e., the voltage on first pin P1 plus the threshold voltage Vth,m2 on second PFET M2. Because the threshold voltage Vth,m2 on second PFET M2 is the same as the threshold voltage Vth,hs on the high-side power NFET, second PFET M2 turns on at the same time that the Miller plateau on high-side power NFET is ended. As second PFET M2 turns on, the replica voltage Vreplica is shared with the reset input R of latch 208 and the output Q of latch 208 goes to zero, turning on fourth PFET M4 to initiate the fast charging of the gate of high-side power NFET Mhs. Both high-side gate voltage Vg,hs and replica voltage Vreplica will reach a final value of (Vin+Vdd). This means that the maximum voltage between gates and sources of first PFET M1 and second PFET M2 will be equal to fourth supply voltage Vdd and guarantees that the oxides on first PFET M1 and second PFET M2 do not suffer from breakdown.

Figure 3:
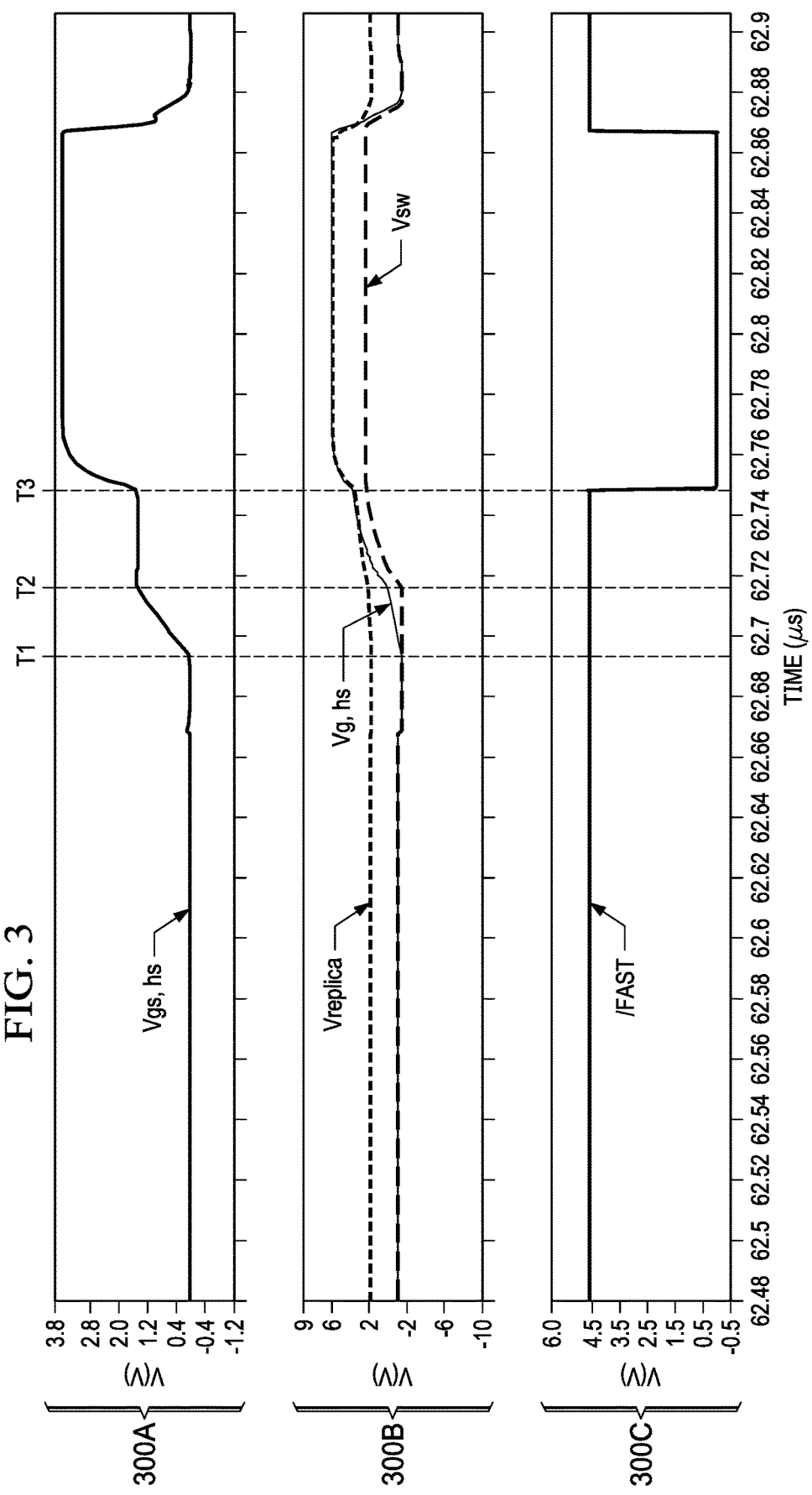
FIG. 3 depicts a number of waveforms provided by the inverting buck boost converter of FIG. 2 according to an embodiment of the disclosure.

FIG. 3 provides simulations of the performance of various signals on inverting buck boost converter 200 according to an embodiment of the disclosure in which input voltage Vin is about 2.4 V and output voltage Vout is about −1.5 V. Graph 300A depicts the high-side gate/source voltage Vgs,hs; graph 300B depicts high-side gate voltage Vg,hs, replica voltage Vreplica and switch-node voltage Vsw; and graph 300C depicts the voltage on fast-driver signal /FAST, which goes low to turn on third PFET M3. As the simulation begins, high-side gate voltage Vg,hs and switch-node voltage Vsw are about −1.5 V, replica voltage Vreplica is about 1.8 V, high-side gate/source voltage Vgs,hs is zero and fast-driver signal /FAST is high.

At time T1, high-side gate voltage Vg,hs begins to rise at a slow rate to avoid noise. Because the high-side gate voltage Vg,hs is rising, high-side gate/source voltage Vgs,hs also begins to rise. At time T2, high-side power NFET Mhs starts to turn on and high-side gate/source voltage Vgs,hs reaches the Miller plateau. During the plateau region, both high-side gate voltage Vg,hs and switch-node voltage Vsw rise in parallel with each other so that high-side gate/source voltage Vgs,hs remains the same. As the value of high-side gate voltage Vg,hs nears the value of replica voltage Vreplica, replica voltage Vreplica rises slightly as the source of first PFET M1 attempts to follow the drain on first PFET M1 until first PFET M1 turns on and both high-side gate voltage Vg,hs and replica voltage Vreplica rise together. At time T3, the end of the Miller plateau is reached on high-side gate/source voltage Vgs,hs and fast-driver signal /FAST goes low, turning on third PFET M3, so that high-side gate voltage Vg,hs and replica voltage Vreplica both rise more quickly to a final value of about 6 V.

Figure 4:
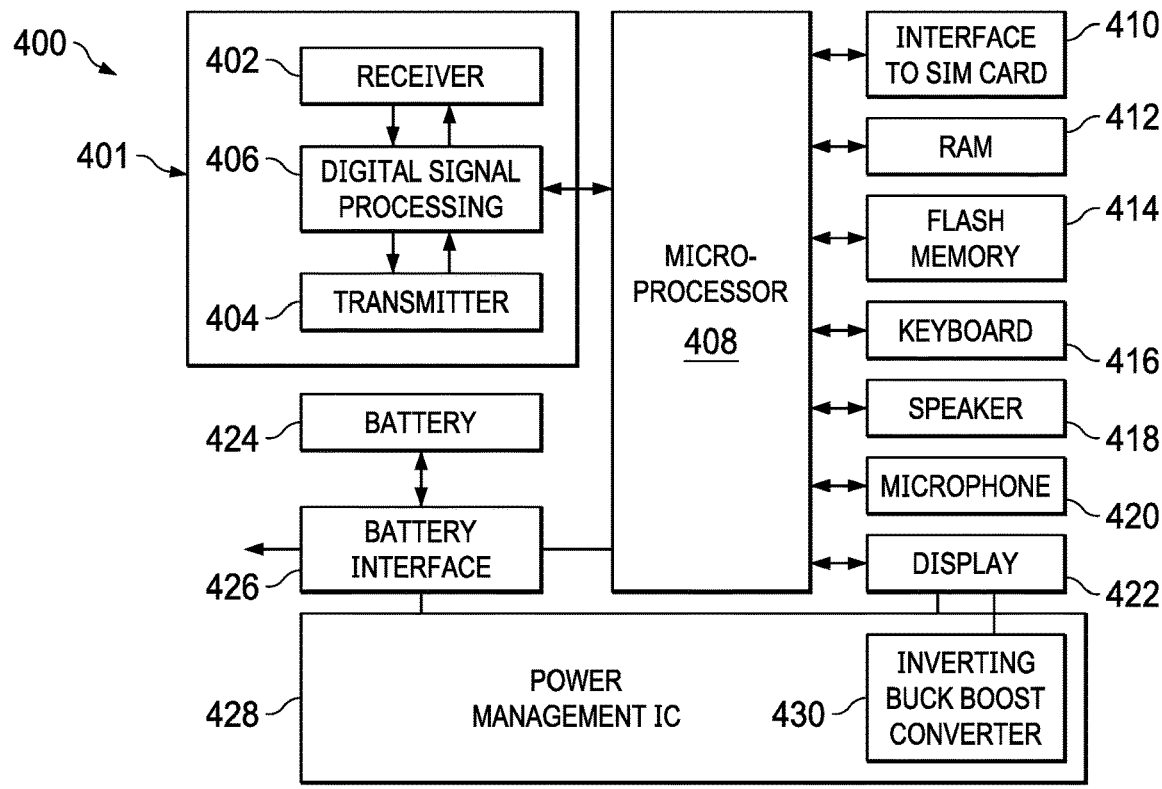
FIG. 4 depicts a block diagram of a display phone that can utilize an inverting buck boost converter and a gate voltage plateau completion circuit according to an embodiment of the disclosure.

FIG. 4 depicts an example of a display phone 400 in which one or more versions of the disclosed DC/DC switching converter can be used. Display phone 400 contains a communications subsystem 401 that includes one or more receivers 402, one or more transmitters 404 and a digital signal processing circuit 406 that allow display phone 400 to interact with various base stations (not specifically shown) and to send and receive data, which can include voice communications. Communications subsystem 401 interfaces with microprocessor 408, which provides overall control of display phone 400.

Microprocessor 408 executes software modules that are stored in memory, e.g., in the flash memory 414; the software modules can include operating system software and various software applications that can include, for example, a browser, email, address book, etc. The software modules may be temporarily loaded into volatile memory such as random access memory 412, which can be used to store data variables and other types of data or information. Microprocessor 408 also interacts with a number of additional circuits that provide specific functionality. The additional circuits can include, but are not limited to an interface to a subscriber identification module (SIM) card 410, keyboard 416, speaker 418, microphone 420 and display 422.

Network access may be associated with a subscriber or user of the display phone 400 through the use of SIM card 410 or other type of memory card for use in a relevant wireless network type. Keyboard 416 can allow the user to provide input to any of the software modules operating on the display phone 400. Keyboard 416 can be a physical keyboard or can be provided via software implementation. Speaker 418 and microphone 420 provide the ability to conduct voice communications with other users through the communications subsystem 401, as well as the ability to play music or recorded sounds, provide audio alarms, notifications and reminders, record messages and provide other audio voice interactions with software modules implemented on display phone 400. Display 422 provides a medium on which the user is able to view information that can be text, graphics, photographs, streaming video or other visual information as implemented using available software modules.

Power in display phone can be provided using battery 424, which can be a rechargeable battery. Battery interface 426 provides circuitry operable to charge battery 424, e.g., when display phone 400 is connected to a power source. In some embodiments, battery interface 426 can include a "wireless" charger, such as an inductive charger, to charge battery 424 without relying on a physical connection to a power source. In some embodiments, other power sources, such as a solar cell, can be provided in addition to or instead of battery 424. A power management IC 428 is coupled to battery interface 426 to provide distribution and control of a number of power supplies utilized within display phone 400. Power management IC 428 can include any number of DC/DC switching converters to provide each of the voltage levels needed by the circuits of display phone 400. In one embodiment, display 422 requires both a positive voltage and a negative voltage. In one embodiment, inverting buck boost converter 430 is coupled to provide a negative voltage to display 422. In at least one embodiment, inverting buck boost converter 430 is configured as disclosed with regard to inverting buck boost converter 200.

Figure 5:
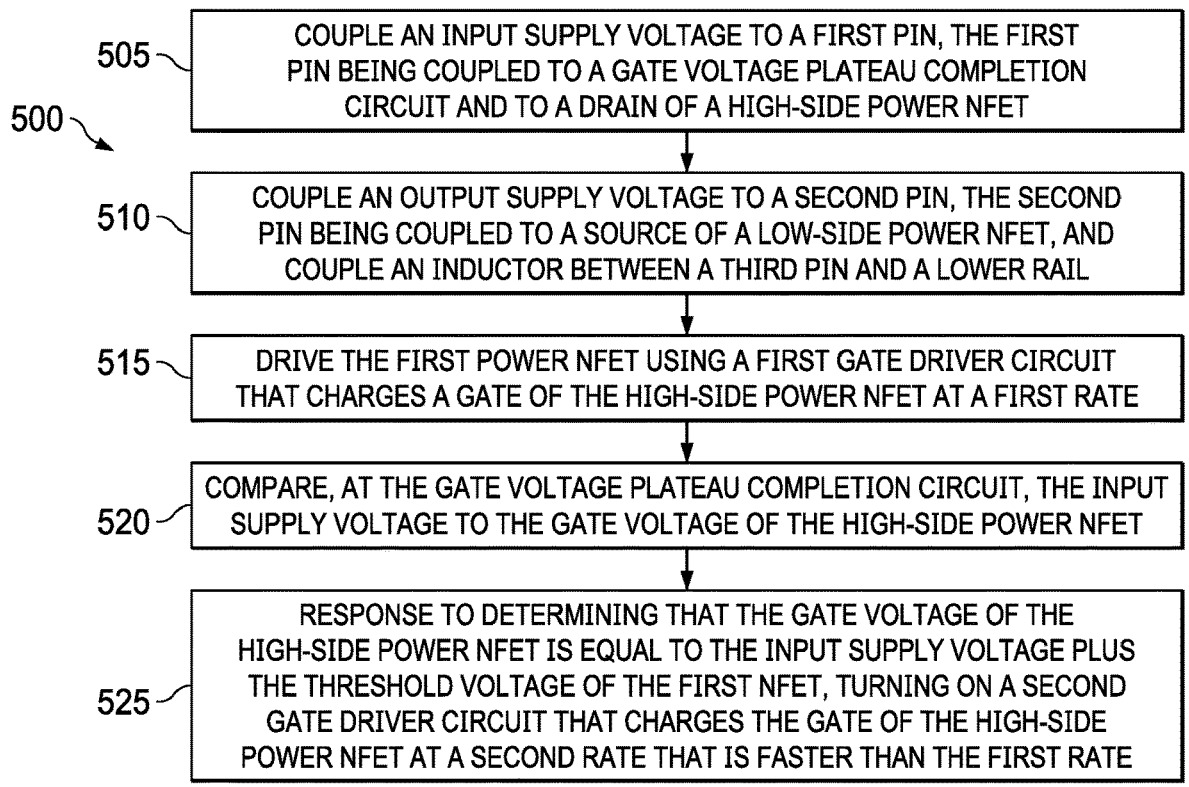
FIG. 5 depicts a method of operating a DC/DC switching converter according to an embodiment of the disclosure.

FIG. 5 depicts a method 500 of operating an integrated circuit chip that includes a DC/DC switching converter. Method 500 starts with coupling 505 an input supply voltage to a first pin, where the first pin is coupled to a gate voltage plateau completion circuit and to a drain of a high-side power NFET. At the same time, an output supply voltage is coupled 510 to a second pin that is coupled to a source of a low-side power NFET and an inductor is coupled between a third pin and a lower rail. The high-side power NFET is driven 515 using a first gate driver circuit that charges a gate of the high-side power NFET at a first rate. The first rate is generally a slower rate that is selected to prevent the production of EMI by the DC/DC switching converter. The gate voltage plateau completion circuit compares 520 the input supply voltage to the gate voltage of the high-side power NFET. Responsive to determining that the gate voltage of the high-side power NFET is equal to the input supply voltage plus the threshold voltage of the high-side power NFET, turning on 520 a second gate driver circuit that charges the gate of the high-side power NFET at a second rate that is faster than the first rate.

The disclosed embodiments provide a circuit that more accurately detects the end of the Miller plateau in the gate/source voltage of a power NFET. In at least one embodiment, detection of the end of the Miller plateau means that the slew rate of the gate voltage for the power NFET can be increased at an optimal moment. Appropriate slew rate control in turn provides accurate inductor sampling and stability of the chip, as well as providing efficiency by providing a minimum on-resistance Rds_on at the earliest moment.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An electronic device comprising:
    a first power N-type field effect transistor (NFET) coupled in series with a second power NFET between a first pin for coupling to a first supply voltage and a second pin for coupling to a second supply voltage, a switch-node between the first power NFET and the second power NFET being coupled to a third pin for coupling through an inductor to a third supply voltage;
    a first gate driver coupled to receive a first on-signal and to drive a gate voltage on the first power NFET at a first rate;
    a second gate driver coupled to receive a second on-signal and to drive the gate voltage of the first power NFET at a second rate that is higher than the first rate; and
    a comparator coupled to the first pin and to a gate of the first power NFET and further coupled to turn on the second gate driver when the gate voltage of the first power NFET is equal to the first supply voltage coupled to the first pin plus a threshold voltage of the first power NFET.

2. The electronic device as recited in claim 1 in which the comparator includes:
    a first P-type field effect transistor (PFET) coupled in series with a second PFET between the gate of the first power NFET and an input to the second gate driver, the first PFET and the second PFET having respective sources coupled together, the gate of the first PFET and a gate of the second PFET being coupled to the first pin; and
    one or more diodes coupled between the gate of the first power NFET and the respective sources of the first PFET and the second PFET.

3. The electronic device as recited in claim 2 in which the one or more diodes includes a plurality of diodes coupled in series, a cathode of a first diode of the plurality of diodes being coupled to a first node between the first PFET and the second PFET and an anode of a last diode of the plurality of diodes being coupled to the first pin.

4. The electronic device as recited in claim 3 in which the second gate driver includes:
    a third PFET coupled between a fourth supply voltage and the gate of the first power NFET; and
    a latch having an output coupled to a gate of the third PFET, a set input coupled to an input to the first gate driver and a reset input coupled to a drain of the second PFET.

5. The electronic device as recited in claim 4 in which the second gate driver includes:
    a first switch coupled between a lower rail and the reset input of the latch; and
    an inverter coupled to the input to the first gate driver and further coupled to control the first switch.

6. The electronic device as recited in claim 5 in which the first gate driver includes:
    a high-side driver circuit coupled to receive a high-side control signal;
    a bootstrap capacitor coupled between an output of the high-side driver circuit and the gate of the first power NFET;
    a fourth PFET coupled between the bootstrap capacitor and the gate of the first power NFET, the fourth PFET having a gate coupled to the first pin;
    a second switch coupled between the gate of the fourth PFET and a source of the fourth PFET, and
    a third switch coupled between the switch-node and a drain of the fourth PFET.

7. The electronic device as recited in claim 6 in which the first pin is coupled to an input voltage, the second pin is coupled to an output voltage and the third pin is coupled to a ground plane through the inductor.

8. The electronic device as recited in claim 7 in which the electronic device includes one of an integrated circuit (IC) chip, a power management integrated circuit and a display phone.

9. A process of operating an integrated circuit (IC) chip that comprises a DC/DC switching converter, the process comprising:
    coupling an input supply voltage to a first pin, the first pin being coupled to a gate voltage plateau completion circuit and to a drain of a high-side power N-type power field effect transistor (NFET);

driving the high-side power NFET using a first gate driver circuit that charges a gate of the high-side power NFET at a first rate;

comparing, at the gate voltage plateau completion circuit, a gate voltage of the high-side power NFET to the input supply voltage plus a threshold voltage of the high-side power NFET; and responsive to determining that the gate voltage of the first NFET is equal to the input voltage plus the threshold voltage of the high-side power NFET, turning on a second gate driver circuit that charges the gate of the high-side power NFET at a second rate that is faster than the first rate.

10. The process as recited in claim 9 including:

coupling an output supply voltage to a second pin that is coupled to a source of a low-side power NFET; and coupling an inductor between a third pin and a lower rail.

\* \* \* \* \*